United States Patent [19]

Nishikawa et al.

[11] Patent Number: 5,786,634
[45] Date of Patent: Jul. 28, 1998

[54] SEMICONDUCTOR DEVICE

[75] Inventors: Kiyoshi Nishikawa; Mitsunori Nakatani; Katsuya Kosaki, all of Tokyo, Japan

[73] Assignee: Mitsubishi Denki Kabushiki Kaisha, Tokyo, Japan

[21] Appl. No.: 773,993

[22] Filed: Dec. 29, 1996

[30] Foreign Application Priority Data

Sep. 2, 1996 [JP] Japan .................. 8-232242

[51] Int. Cl.⁶ .................. H01L 23/34; H01L 23/10; H01L 23/06
[52] U.S. Cl. .................. 257/717; 257/712; 257/720; 257/703; 257/706; 438/465
[58] Field of Search .................. 257/717, 712, 257/706, 703, 711, 720, 713, 723; 438/465

[56] References Cited

U.S. PATENT DOCUMENTS

| | | | |
|---|---|---|---|
| 3,896,479 | 7/1975 | Di Lorenzo et al. | 257/712 |
| 5,144,413 | 9/1992 | Adlerstein | 257/707 |
| 5,338,967 | 8/1994 | Kosaki | 257/707 |
| 5,457,072 | 10/1995 | Tamaki et al. | 437/226 |

FOREIGN PATENT DOCUMENTS

| | | |
|---|---|---|
| 1164084 | 6/1989 | Japan . |
| 536874 | 2/1993 | Japan . |
| 774282 | 3/1995 | Japan . |
| 7288299 | 10/1995 | Japan . |

*Primary Examiner*—Mahshid D. Saadat
*Assistant Examiner*—Jhihan B. Clark
*Attorney, Agent, or Firm*—Leydig, Voit & Mayer, Ltd.

[57] ABSTRACT

A semiconductor device includes a semiconductor substrate having first and second main surfaces; a function element layer having heating element portions generating heat during operation, disposed on the first main surface that is thinned; and a plated heat sink of a heat conductive material, having a thickness equal to or greater than that of the semiconductor substrate, disposed on a circumferential region of the second main surface at the perimeter of the semiconductor substrate inward, on main heat generating regions of the second main surface including regions opposite the heating element portions, and on supporting regions of the second main surface connecting the circumferential region to the main heat generating regions. The semiconductor device maintains the heat generating function and the handling performance of the plated heat sink, reduces internal stress during plating and repeated stress produced by heat cycles during fabricating processes, and lessens chip breakage and plating peeling.

6 Claims, 6 Drawing Sheets

Prior Art

SEMICONDUCTOR DEVICE

FIELD OF THE INVENTION

The present invention relates to a high-frequency and high-power semiconductor device including a plated heat sink (hereinafter referred to as PHS), having a thickness equal to or greater than a thickness of a GaAs substrate that is thinned, and disposed on the rear surface of the GaAs substrate and, more particularly, to a semiconductor device reducing chip warping and solder peeling due to stress between the GaAs substrate and the PHS, and a fabricating method thereof.

BACKGROUND OF THE INVENTION

Figure 9:
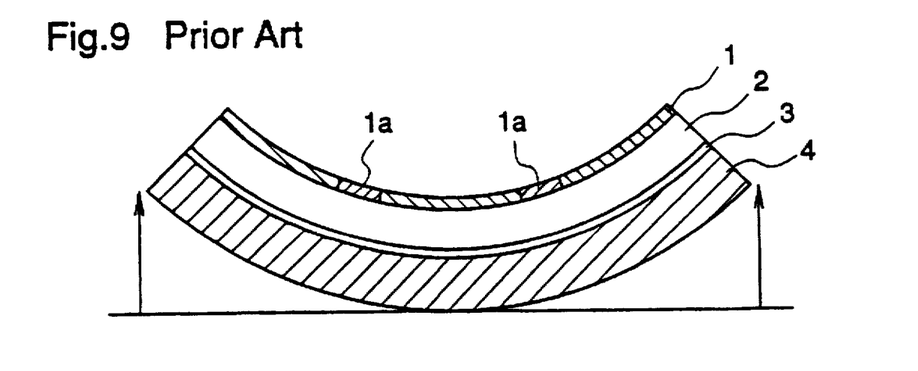
FIG. 9 is a cross-sectional view illustrating warping of a semiconductor device having a PHS according to the prior art.
Figure 10:
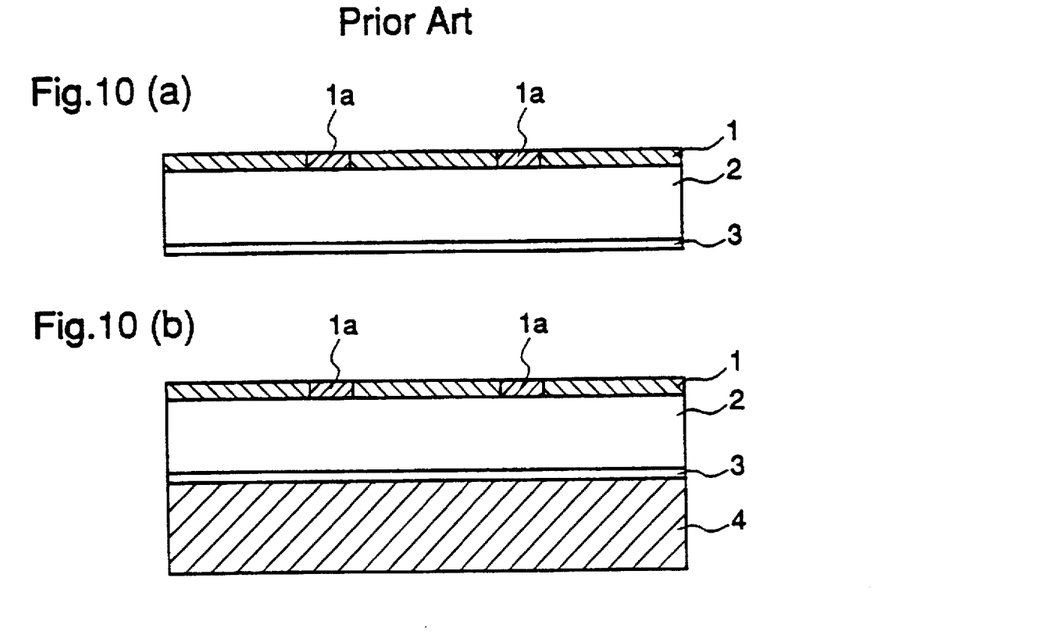
FIGS. 10(a) and 10(b) are cross-sectional views illustrating process steps in a method of fabricating a semiconductor device having a PHS according to the prior art.

FIGS. 9 and 10(a)–10(b) show prior art high-frequency and high-power semiconductor devices, respectively. FIG. 9 is a cross-sectional view illustrating a semiconductor device warping due to stress produced between a substrate and a PHS. FIGS. 10(a) and 10(b) are cross-sectional views respectively illustrating the semiconductor device before and after forming the PHS during fabricating processes. In these figures, reference numeral 1 designates a function element layer including heating element portions 1a, numeral 2 designates a semiconductor substrate, 3 designates a feeding layer comprising Ni, and numeral 4 designates a PHS comprising Au.

This semiconductor device is fabricated as follows. The function element layer 1 including the heating element portions 1a is formed on the front surface of the semiconductor substrate 2 having a thickness of about 600 µm, preferably by conventional ion implantation and etching. Thereafter, the rear surface of the semiconductor substrate 2 is ground to a thickness of about 30 µm. In the step of FIG. 10(a), the rear surface of the semiconductor substrate 2 is Ni-plated to form the feeding layer 3. Then, as shown in FIG. 10(b), the rear surface of the feeding layer 3 is Au-plated to a thickness equal to or greater than the thickness of the substrate, i.e., not less than about 30 µm, to form the PHS 4.

A description is given of the PHS structure of the semiconductor device.

Figure 11:
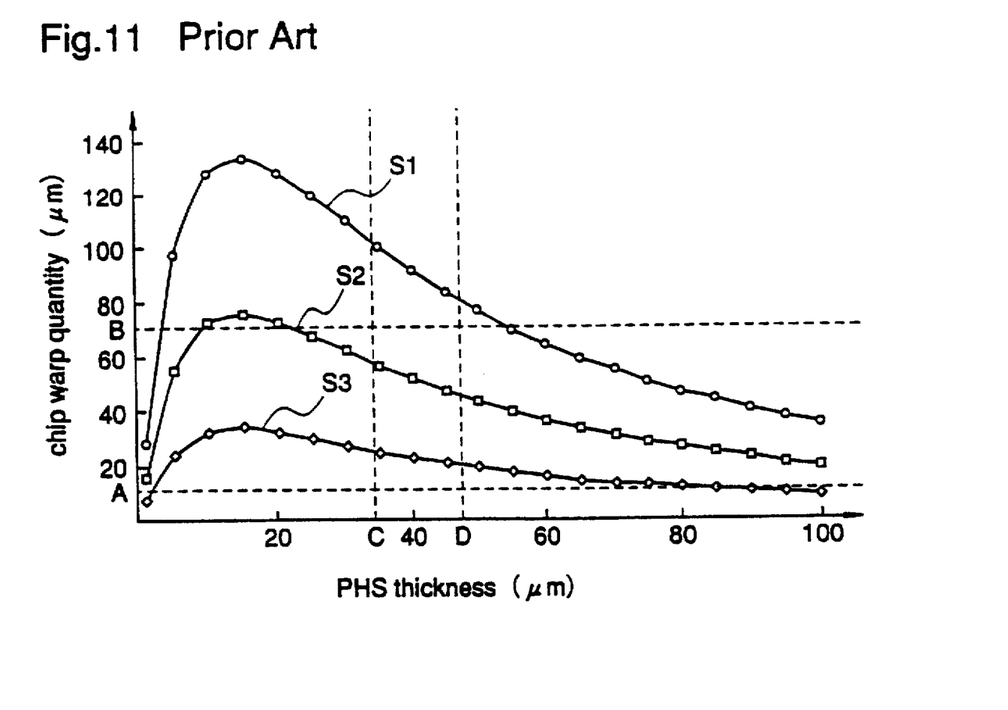
FIG. 11 is a graph showing a relation between PHS thickness and chip warping according to the prior art.

In a high-frequency and high-power semiconductor device, a GaAs substrate is mainly employed and the rear surface of the GaAs substrate is ground to reduce its thickness in order to release heat produced during operation efficiently. FIG. 11 is a graph showing a relation between the thickness of a PHS formed on a thinned substrate and chip warping when the temperature varies from 300° C. to 25° C. for a chip having a substrate thickness of 27.5 µm. In FIG. 11, S1, S2 and S3 represent samples having chip lengths of 4 mm, 3 mm and 2 mm, respectively. A represents a target value of the chip warping, and B represents an upper limit of the chip warping permissible in assembling of the chip. The range represented by C and D indicates the PHS thicknesses adopted in semiconductor devices including the PHS, which are mainly fabricated at present.

The chip warping is due to internal stress that is accumulated between the semiconductor substrate and the PHS during the plating process in PHS formation. Although the warping varies with the substrate thickness and the plating conditions of the, for example, temperature, current density and time, mostly as shown in FIG. 11, the warping has a peak in the region where the PHS is slightly thinner than the substrate thickness, and the warping gradually decreases with increasing PHS thickness. Therefore, the chip warping can be reduced by making the PHS sufficiently thick.

However, an increase in the PHS thickness will increase the fabricating costs including material cost. Consequently, the prior art PHS thicknesses mostly range from C to D shown in FIG. 11, i.e., equal or are greater than the substrate thickness.

As described above, in the prior art semiconductor device in which the PHS is formed on the entire rear surface of the semiconductor substrate, the PHS thickness is in a range between C and D shown in FIG. 11, whereby the internal stress produced between the semiconductor substrate and the PHS during the plating process is relaxed and chip warping is suppressed. However, in the semiconductor device including the PHS having a thickness in this range, it is impossible to satisfactorily prevent chip warping, chip breakage due to cracks, and plating peeling during the fabricating processes, which are due to residual stress between the substrate and the PHS from the plating process.

Further, in the chip including the PHS with a thickness equal to or greater than the substrate thickness, repeated stress caused by the difference in thermal expansion coefficients of the semiconductor substrate and the PHS is produced by heat cycling during the fabricating processes, resulting in chip breakage and plating peeling.

SUMMARY OF THE INVENTION

It is an object of the present invention to provide a semiconductor device, which maintains the heat generating function and a performance of a PHS, reduces internal stress produced during plating and repeated stress produced by heat cycling during fabricating processes, and lessens chip breakage and plating peeling.

It is another object of the present invention to provide a method of fabricating the semiconductor device.

Other objects and advantages of the present invention will become apparent from the detailed description given hereinafter; it should be understood, however, that the detailed description and specific embodiment are given by way of illustration only, since various changes and modifications within the scope of the invention will become apparent to the those skilled in the art from this detailed description.

According to a first aspect of the present invention, in a semiconductor device including a function element layer which has heating element portions generating heat during operation, and is disposed on a first main surface of a semiconductor substrate that is thinned, and a plated heat sink (PHS) comprising a good heat conductive material, which has a thickness equal to or greater than that of the semiconductor substrate, and is disposed on a second main surface of the semiconductor substrate, the PHS is disposed selectively on a circumferential region of the second main surface of the semiconductor substrate having a prescribed width from the circumference toward the inside, on main heat releasing regions of the second main surface of the semiconductor substrate which comprise regions opposite to the heating element portions and their surrounding regions, and on supporting regions of the second main surface of the semiconductor substrate connecting the circumferential region to the main heat releasing regions. Therefore, it is obtainable a semiconductor device which maintains the heat releasing function and the handling performance of the PHS, reduces internal stress produced during plating and repeated stress produced by heat cycles during fabricating processes, and lessens chip break and plating peeling.

According to a second aspect of the present invention, in the above-described semiconductor device, a nickel layer is disposed at least on regions of the second main surface of the semiconductor substrate where no PHS is provided, and on the surfaces of the PHS facing cavities in which no PHS is provided. Therefore, solder rising caused when the PHS is adhered to a carrier with a solder is suppressed.

According to a third aspect of the present invention, in the above-described semiconductor device, an AuSn alloy layer is disposed on a growth surface of the PHS. Therefore, solder rising caused when the PHS is adhered to a carrier with a solder is suppressed, and the process for adhering is facilitated.

According to a fourth aspect of the present invention, a method of fabricating a semiconductor device including the function element layer which has the heating element portions generating heat during operation, and is disposed on the first main surface of the semiconductor substrate that is thinned, and the PHS comprising a good heat conductive material, which has having a thickness equal to or greater than that of the semiconductor substrate, and is disposed on the second main surface of the semiconductor substrate, includes forming the function element layer having the heating element portions on the first main surface of the semiconductor substrate before being thinned; grinding the second main surface of the semiconductor substrate before being thinned to reduce its thickness; forming a resist having a thickness greater than that of the PHS on the second main surface of the semiconductor substrate; selectively removing the resist formed on the circumferential region of the second main surface of the semiconductor substrate having a prescribed width from the circumference toward the inside, on the main heat releasing regions of the second main surface of the semiconductor substrate including regions opposite to the heating element portions and their surrounding regions, and on the supporting regions of the second main surface of the semiconductor substrate connecting the circumferential region to the main heat releasing regions; and forming the PHS comprising a good heat conductive material, whose thickness equals or is greater than the thickness of the semiconductor substrate, on the regions of the second main surface of the semiconductor substrate from which the resist is removed. Therefore, it is possible to fabricate the semiconductor device which maintains the heat releasing function and the handling performance of the PHS, lowers internal stress produced during plating and repeated stress produced by heat cycles during fabricating processes, and lessens chip break and plating peeling.

DETAILED DESCRIPTION OF THE PREFERRED EMBODIMENT

Embodiment 1

Figure 1:
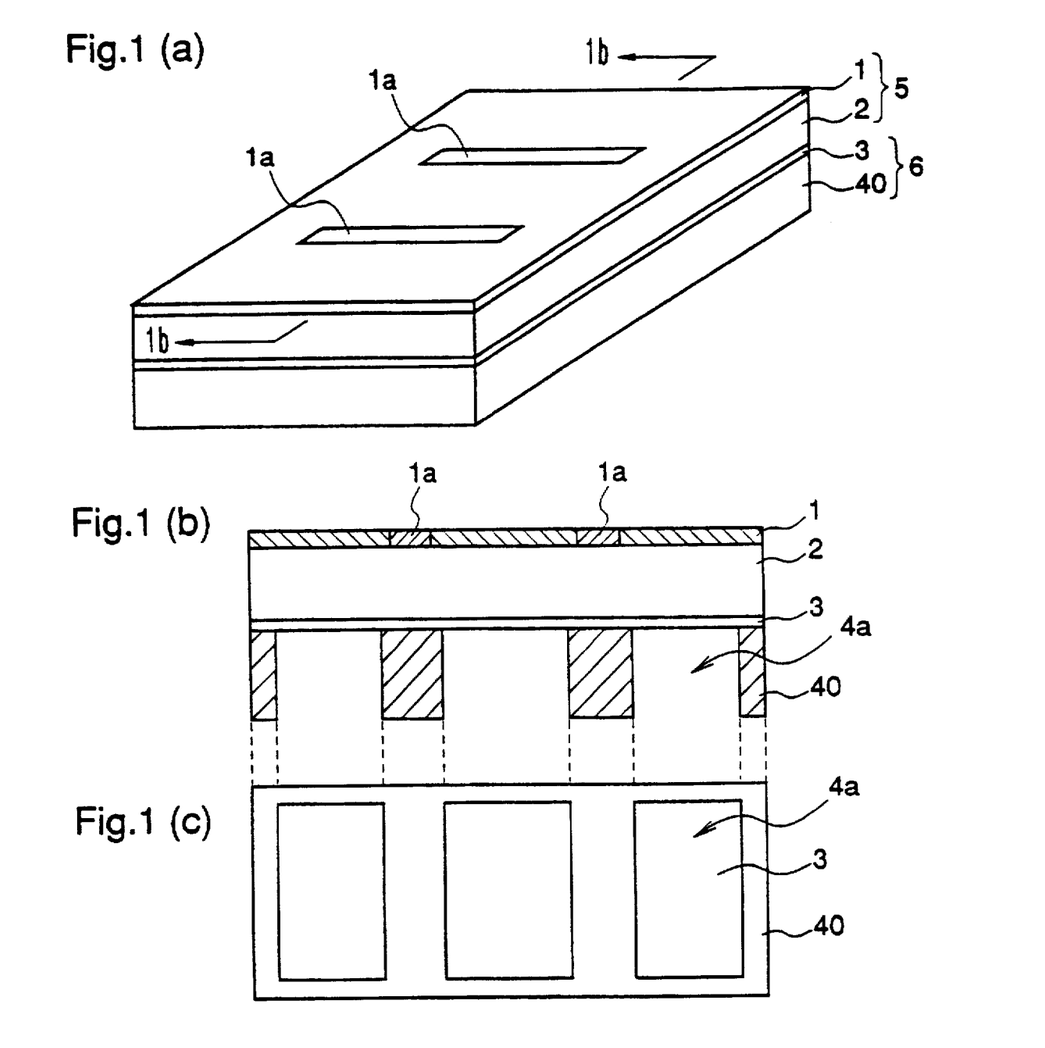
FIGS. 1(a)–1(c) are respectively a perspective view, a cross-sectional view taken along a line 1b—1b, and a bottom view, each illustrating a semiconductor device in accordance with a first embodiment of the present invention.

FIGS. 1(a)–1(c) are respectively a perspective view, a cross-sectional view taken along a line 1b—1b, and a bottom view, each illustrating a semiconductor device according to a first embodiment of the present invention. In these figures, reference numeral 1 designates a function element layer including heating element portions 1a, and numeral 2 designates a semiconductor substrate comprising GaAs. A semiconductor chip 5 comprises the function element layer 1 and the semiconductor substrate 2. Reference numeral 3 designates a feeding layer that is plated Ni, numeral 40 designates a PHS, and numeral 4a designates a cavity where no PHS 40 is provided. A heat generating electrode 6 comprises the feeding layer 3 and the PHS 40. The PHS 40 is made of Au. The Au is laminated on a circumferential region of the front surface of the feeding layer 3 having a prescribed width from the perimeter of the substrate inward, on main heat generating regions of the front surface of the feeding layer 3 including regions opposite the heating element portions 1a and their surrounding regions, and on supporting regions of the front surface of the feeding layer 3 connecting the circumferential region to the main heat releasing regions. Further, the PHS 40 has a prescribed thickness equal to or greater than the thickness of the semiconductor substrate 2.

A description is given of a method of fabricating a semiconductor device according to the first embodiment of the invention.

Figure 2:
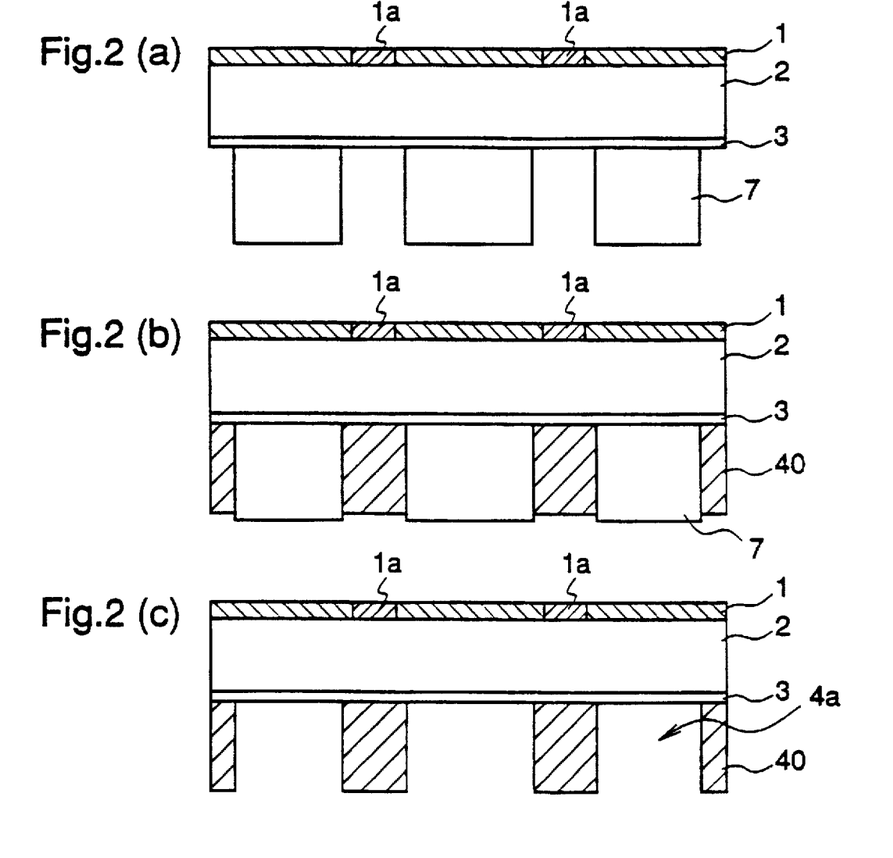
FIGS. 2(a)–2(c) are cross-sectional views illustrating process steps in a method of fabricating a semiconductor device according to the first embodiment of the invention.

FIGS. 2(a)–2(c) are cross-sectional views illustrating process steps in the fabricating method. In these figures, the same reference numerals as shown in FIGS. 1(a)–1(c) designate the same or corresponding parts. Reference numeral 7 designates a resist.

Initially, as in the prior art processes, the function element layer 1 including the heating element portions 1a is formed on the front surface of the semiconductor substrate 2 having a thickness of about 600 μm, preferably by ion implantation and etching. Thereafter, the semiconductor substrate 2 is ground at the rear surface to a thickness of about 30 μm. In the step of FIG. 10(a), the entire rear surface of the semiconductor substrate 2 is Ni-plated to form the feeding layer 3.

Then, a resist is applied to the entire front surface of the feeding layer 3. The thickness of the resist exceeds the thickness of the PHS 40, i.e., the prescribed thickness equal to or greater than the substrate thickness of 30 μm. In the step of FIG. 2(a), by photolithographic techniques, the resist 7 having apertures is formed over a circumferential region of the front surface of the feeding layer 3 having a prescribed width from the perimeter of the substrate inward, over main heat generating regions of the front surface of the feeding layer 3 including regions opposite the heating element portions 1a and their surrounding regions, and over supporting regions of the front surface of the feeding layer 3 connecting the circumferential region to the main heat releasing regions.

Using the resist 7 having the apertures as a mask, by electrolytic plating, Au is laminated to the aforesaid thickness, thereby forming the PHS 40 as shown in FIG. 2(b), followed by the removal of the resist 7, completing a semiconductor device shown in FIG. 2(c).

Figure 3:
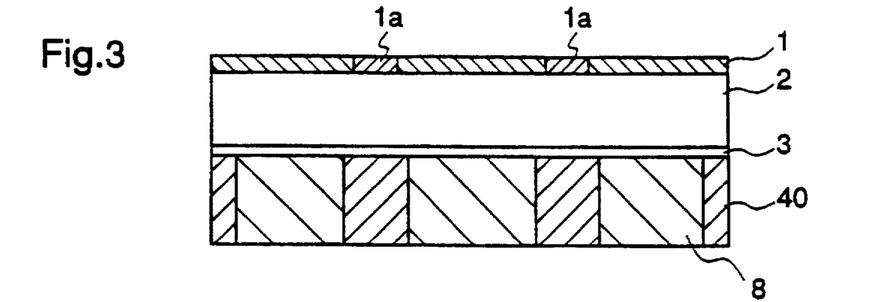
FIG. 3 is a cross-sectional view illustrating another semiconductor device according to the first embodiment of the invention.
Figure 4:
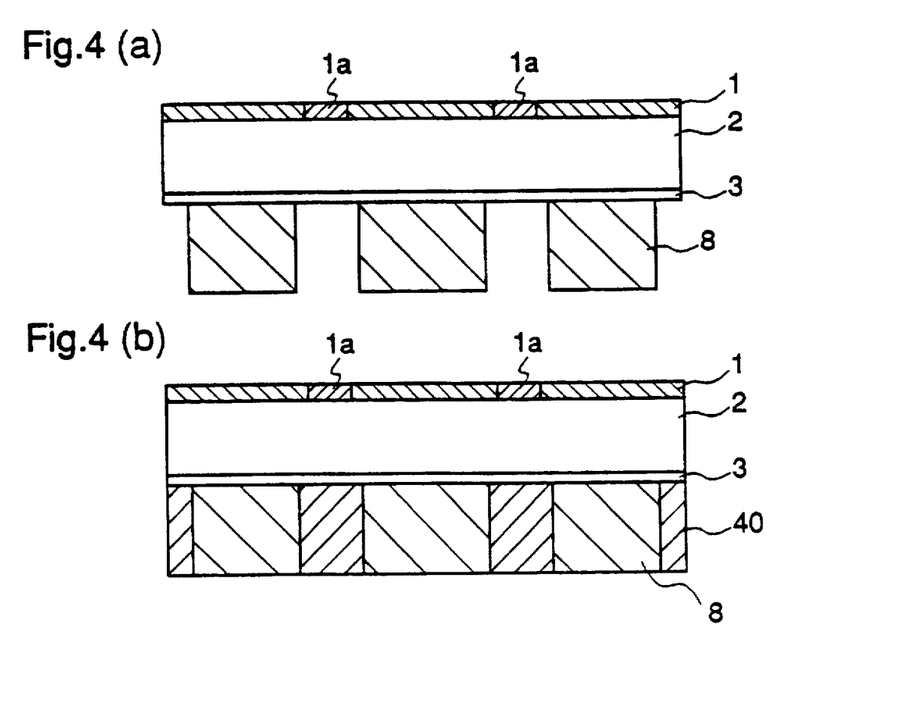
FIGS. 4(a) and 4(b) are cross-sectional views illustrating process steps in a method of fabricating another semiconductor device according to the first embodiment of the invention.

FIG. 3 is a cross-sectional view illustrating another semiconductor device according to the first embodiment of the invention. In place of the resist 7 shown in FIGS. 2(a) and 2(b), polyimide resin, a photosensitive material, is employed, and the polyimide resin is left without being removed. FIGS. 4(a) and 4(b) are cross-sectional views illustrating process steps in a method of fabricating a semiconductor device. In these figures, the same reference numerals as used in FIGS. 1(a)-1(c) designate the same or corresponding parts. Reference numeral 8 designates the polyimide resin.

A description is given of the fabricating method.

Initially, as in the above-described processes, the function element layer 1 including the heating element portions 1a is formed on the front surface of the semiconductor substrate 2. Thereafter, the semiconductor substrate 2 is ground at the rear surface to a thickness of about 30 μm, and the feeding layer 3 is formed on the entire rear surface of the semiconductor substrate 2.

Then, the polyimide resin is laminated on the entire front surface of the feeding layer 3. The thickness of the polyimide resin exceeds the thickness of the PHS 40, i.e., the prescribed thickness equal to or greater than the substrate thickness of 30 μm. In the step of FIG. 4(a), by photolithographic techniques, the polyimide resin 8 having apertures is formed over the circumferential region, the main heat generating regions and the supporting regions of the front surface of the feeding layer 3.

Using the polyimide resin 8 having the apertures as a mask, by electrolytic plating, Au is laminated to the aforesaid thickness, thereby forming the PHS 40 as shown in FIG. 4(b), completing a semiconductor device.

Although, in FIGS. 1(a)-1(c), 2(a)-2(c), 3, and 4(a)-4(b), the semiconductor device including the feeding layer 3 is described, a semiconductor device having no feeding layer may also be produced. In this case, the PHS 40 is formed directly on the rear surface of the semiconductor substrate 2 by selective electroless plating employing a mask such as a resist, in place of electrolytic plating.

A description is given of the function and the effect of the semiconductor device according to the first embodiment.

In the semiconductor device having the PHS, internal stress produced between the semiconductor substrate 2 and the PHS 40 during plating in the PHS formation, and repeated stress due to the difference in thermal expansion coefficients of the semiconductor substrate 2 and the PHS 40, which is produced by heat cycling during the fabricating processes, depend on the area of the region where the PHS is formed. Therefore, by reducing the area of the region where the PHS is formed, the internal stress and the repeated stress can be reduced. The PHS is, however, provided for generating heat produced during operation. To simply reduce the PHS forming area causes significant decreases in heat releasing effect and strength of the PHS.

Thus, in the first embodiment, the PHS is formed in view of heat generation during operation that does not occur from the entire of the function element layer 1, but from the heating element portions 1a in the function element layer 1. When the PHS is provided in least at the vicinity of the circumference of the chip and at portions requiring support reinforcement, the strength of the PHS and the electrical connection, such as grounding, can be maintained. Specifically, the PHS is formed selectively, i.e., only, on the circumferential region, at the rear surface of the semiconductor substrate 2, having a prescribed width from the perimeter inward, on the main heat generating regions at the rear surface side of the semiconductor substrate 2. Included are the regions opposite to the heating element portions 1a and their surrounding regions, and the supporting regions at the rear surface side of the semiconductor substrate 2 connecting the circumferential region to the main heat generating regions. Consequently, the PHS forming area can be reduced without causing significant decreases in the heat generating effect and the strength of the PHS, whereby a semiconductor device having less chip breakage and plating peeling is realized.

In addition, in another semiconductor device shown in FIGS. 3 and 4(a)-4(b) according to the first embodiment, using the polyimide resin 8 in place of the resist 7 shown in FIGS. 1(a)-1(c), the semiconductor device is fabricated without removing the polyimide resin after the PHS formation. Accordingly, the regions of the front surface of the feeding layer 3 where no PHS 40 is present, i.e., the cavities 4a shown in FIGS. 1(a)-1(c) and 2(a)-2(c), are filled with the polyimide resin 8, thereby obtaining a semiconductor device having a higher strength, as compared with the semiconductor device shown in FIGS. 1(a)-1(c).

Further, in place of the polyimide resin 8, there may be employed a material which can reduce the internal stress produced between the semiconductor substrate and the PHS, and the stress caused by the difference in thermal expansion coefficients between the semiconductor substrate and the PHS, whereby a semiconductor device having less chip breakage and plating peeling is obtained.

Embodiment 2

Figure 5:
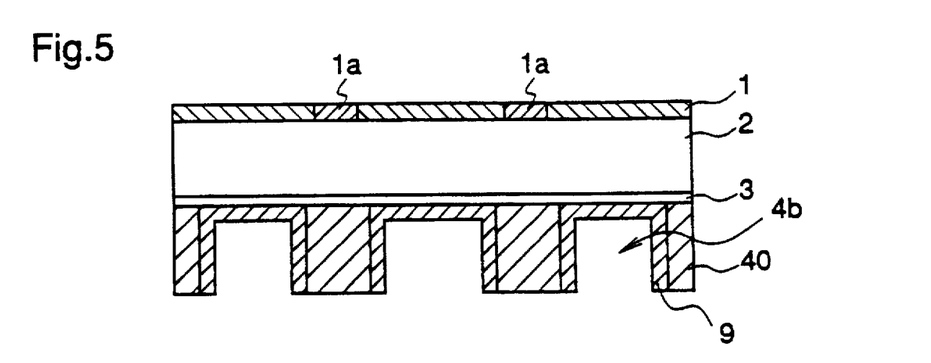
FIG. 5 is a cross-sectional view illustrating a semiconductor device in accordance with a second embodiment of the present invention.

FIG. 5 is a cross-sectional view illustrating a semiconductor device according to a second embodiment of the present invention. In the figure, the same reference numerals as used in FIGS. 1(a)-1(c) designate the same or corresponding parts. Reference numeral 9 designates a nickel layer, and numeral 4b designates a cavity where neither the PHS 40 nor the nickel layer 9 is provided. In the semiconductor device according to the second embodiment, the nickel layer 9 is disposed at least on regions of the front surface of the feeding layer 3 at the rear surface of the semiconductor substrate 2 where no PHS is provided, and on the surfaces of the PHS 40 facing the cavities 4b.

A description is given of the fabricating method.

Figure 6:
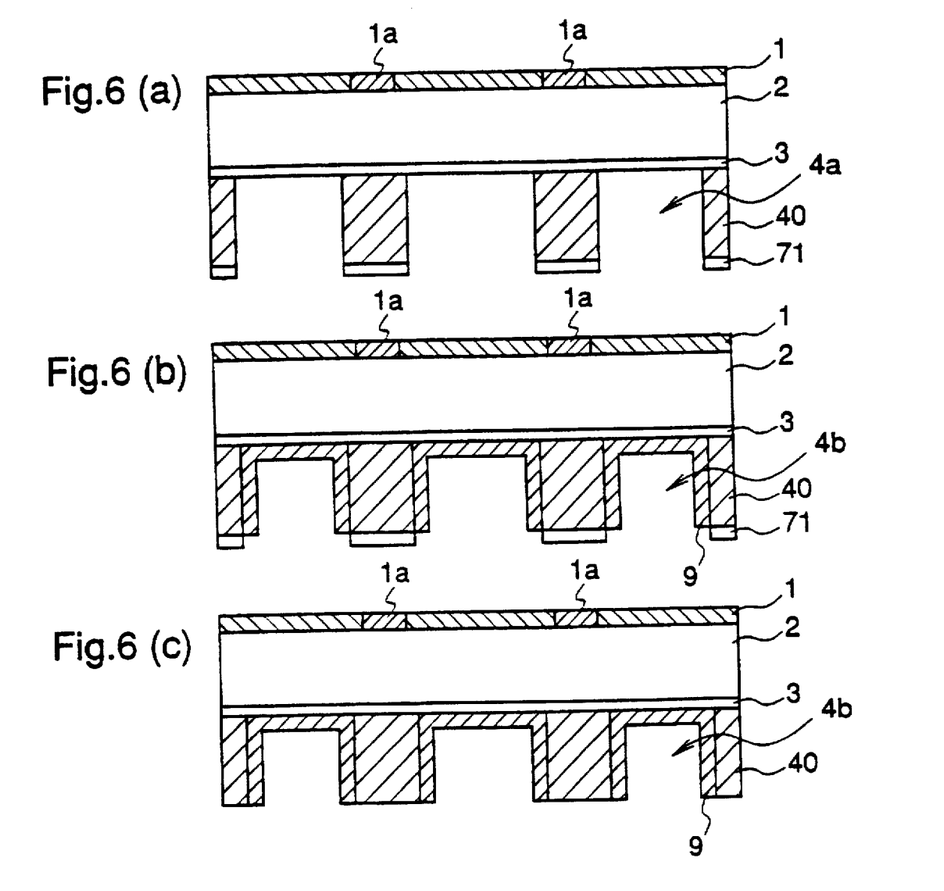
FIGS. 6(a)–6(c) are cross-sectional views illustrating process steps in a method of fabricating a semiconductor device according to the second embodiment of the invention.

FIGS. 6(a)-6(c) are cross-sectional views illustrating process steps in a method of fabricating a semiconductor device according to the second embodiment. In these figures, the same reference numerals as used in FIGS. 1(a)-1(c) designate the same or corresponding parts. Reference numeral 71 designates a resist that is formed on the growth surface of the PHS.

Initially, as in the first embodiment, the resist 7 is removed after the PHS formation. Further, as shown in FIG. 6(a), the resist 71 is formed on the growth surface of the PHS 40. Using the resist 71 as a mask, Ni-plating is performed to the rear surface side of the semiconductor substrate 2 to form the nickel layer 9 as shown in FIG. 6(b), at least on regions of the front surface of the feeding layer 3 where no PHS is present, and on the surfaces of the PHS 40 facing the cavities 4b. Then, the resist 71 is removed as shown in FIG. 6(c), completing a semiconductor device.

Although in FIGS. 5 and 6(a)-6(c), the nickel layer 9 is not formed on the outer side surface of the PHS 40, the nickel layer 9 may be formed on the outer side surface of the PHS 40, provided that it is not formed on the plated surface of the PHS 40.

A description is given of the function and the effect of the semiconductor device according to the second embodiment.

When a semiconductor device having the PHS as in the first embodiment is mounted and assembled on a carrier (not shown), there is generally employed a method in which melted solder is dropped on the carrier and the carrier is adhered to the PHS with the solder. However, if the semiconductor device described in the first embodiment is adhered to a carrier with solder, because the wetting power of the Au of the PHS 40 and the solder, mainly an alloy of Au and Sn, is strong, the solder rises and is adhered not only to the bottom surface, i.e., the plated surface, of the PHS 40 but to the side surfaces of the PHS 40 (hereinafter referred to as solder rising). In an extreme case, the cavities 4a are completely filled with the solder. As a result, when the cavities 4a are filled with the solder, the effects of reducing the internal stress and the stress caused by the difference in thermal expansion coefficient cannot be exhibited satisfactorily.

In the second embodiment of the invention, the nickel layer 9 is formed at least on the regions of the front surface of the feeding layer 3 where no PHS is present, and on the surfaces of the PHS 40 facing the cavities 4b. The nickel layer 9 is liable to be oxidized, and a nickel oxidation product on the surface of the oxidized nickel layer 9 does not mix with a melted Au—Sn solder. Consequently, the solder rising upon the adhesion of the device to the carrier is suppressed and the cavities 4b are prevented from being completely filled with the solder, leading to satisfactory effects of reducing the internal stress and the stress caused by the difference in thermal expansion coefficient.

Although in the second embodiment, the nickel layer 9 is formed on the surfaces of the PHS 40 and on the regions of the front surface of the feeding layer 3, a layer comprising an other metal material that is easily oxidized and has a low resistance may be substituted for the nickel layer.

Embodiment 3

Figure 7:
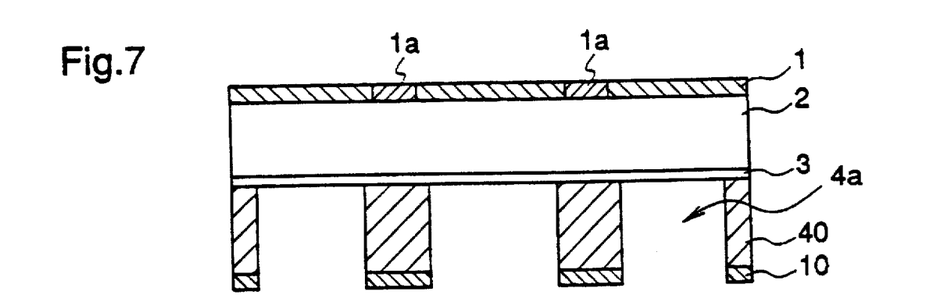
FIG. 7 is a cross-sectional view illustrating a semiconductor device in accordance with a third embodiment of the present invention.

FIG. 7 is a cross-sectional view illustrating a semiconductor device according to a third embodiment of the present invention. In the figure, the same reference numerals as used in FIGS. 1(a)–1(c) designate the same or corresponding parts. Reference numeral 10 designates an AuSn alloy layer. In the semiconductor device according to the third embodiment, the AuSn alloy layer 10 is provided at the plated surface of the PHS 40.

A description is given of the fabricating method.

Figure 8:
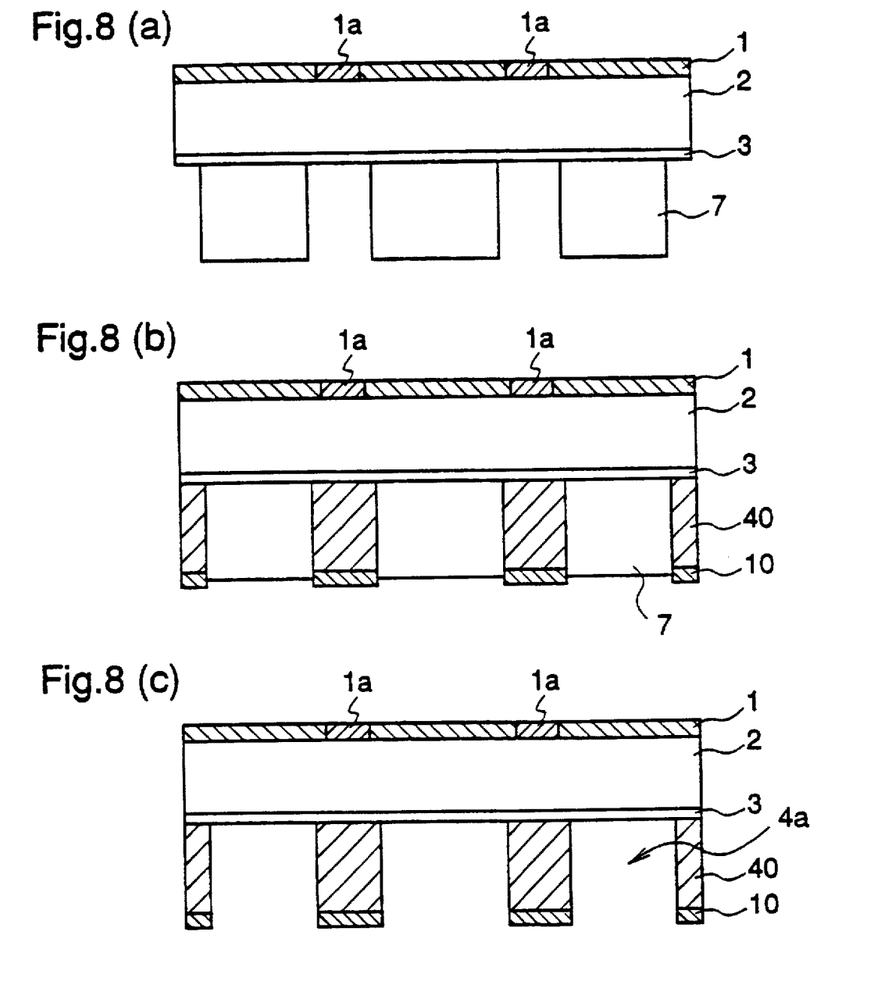
FIGS. 8(a)–8(c) are cross-sectional views illustrating process steps in a method of fabricating a semiconductor device according to the third embodiment of the invention.

FIGS. 8(a)–8(c) are cross-sectional views illustrating process steps in a method of fabricating a semiconductor device according to the third embodiment of the invention. In these figures, the same reference numerals as used in FIGS. 2(a)–2(c) and 7 designate the same or corresponding parts.

Initially, as shown in FIG. 2(a) and described in the first embodiment, after applying the resist, by a photolithographic technique, the resist 7 having apertures is formed at the circumferential region of the front surface of the feeding layer 3 having a prescribed width from the perimeter inward, opposite the main heat generating regions of the front surface of the feeding layer 3 including the regions opposite to the heating element portions 1a and their surrounding regions, and on the supporting regions of the front surface of the feeding layer 3 connecting the circumferential region to the main heat generating regions (FIG. 8(a)).

Then, using the resist 7 having the apertures as a mask, the front surface of the feeding layer 3 is selectively plated with Au to a prescribed thickness, thereby forming the PHS 40. Subsequently, the plated surface of the PHS 40 is plated with AuSn alloy to form the AuSn alloy layer 10 (FIG. 8(b)), and the resist 7 is then removed, completing a semiconductor device shown in FIG. 8(c).

A description is given of the function and the effect of the semiconductor device according to the third embodiment.

As described in the second embodiment, if the semiconductor device having the PHS 40 described in the first embodiment is adhered to a carrier with a solder, excess solder tends to cause solder rising and the cavities 4a are completely filled with the solder. In such a case, the effects of reducing the internal stress and the stress caused by the difference in thermal expansion coefficient cannot be exhibited satisfactorily.

In the third embodiment of the invention, solder is not used when the carrier is adhered to the PHS, and the AuSn alloy layer 10 formed on the bottom surface, i.e., plated surface, of the PHS 40 is melted by heating, so that the PHS 40 is adhered to the carrier through the AuSn alloy layer 10. Therefore, excess solder is not necessary, causing no solder rising. Consequently, the cavities 4a are prevented from being completely filled with the solder. Hence, it is possible to obtain satisfactory effects of reducing the internal stress and the stress caused by the difference in thermal expansion coefficients.

In addition, since the AuSn alloy layer 10 is melted and is mounted on the carrier, the mounting and assembling processes are facilitated.

What is claimed is:

1. A semiconductor device including:

a semiconductor substrate having first and second main surfaces and a thickness between the first and second surfaces;

a function element layer having heating element portions generating heat during operation, disposed on the first main surface of the semiconductor substrate; and a plated heat sink comprising a heat conductive material, having a thickness at least equal to the thickness of the semiconductor substrate, the plated heat sink being disposed only on:

(1) a circumferential region of the second main surface of the semiconductor substrate and having a width from a perimeter of the semiconductor substrate inward;

(2) main heat generating regions of the second main surface of the semiconductor substrate including regions opposite the heating element portions; and (3) supporting regions of the second main surface of the semiconductor substrate connecting the circumferential region to the main heat generating regions.

2. The semiconductor device of claim 5 including a nickel layer disposed on regions of the second main surface of the semiconductor substrate where no plated heat sink is present and on surfaces of the plated heat sink facing the cavities.

3. The semiconductor device of claim 1 wherein an AuSn alloy layer is disposed on a plated surface of the plated heat sink.

4. The semiconductor device of claim 1 wherein the plated heat sink includes cavities between the circumferential region, the main heat generating regions, and the supporting regions, the cavities extending toward the second main surface of the semiconductor substrate.

5. The semiconductor device of claim 1 wherein the cavities are filled with polyimide.

6. The semiconductor device of claim 1 including a metal feeding layer interposed between the second surface of the semiconductor substrate and the plated heat sink.

* * * * *

UNITED STATES PATENT AND TRADEMARK OFFICE
CERTIFICATE OF CORRECTION

PATENT NO. : 5,786,634
DATED : July 28, 1998
INVENTOR(S) : Nishikawa et al.

It is certified that error appears in the above-identified patent and that said Letters Patent is hereby corrected as shown below:

Column 8, Line 47, change "5" to --4--.

Signed and Sealed this

First Day of December, 1998

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,786,634
DATED : July 28, 1998
INVENTOR(S) : Nishikawa et al.

It is certified that error appears in the above-identified patent and that said Letters Patent is hereby corrected as shown below:

Title page item [22], change "December 29, 1996" to --December 26, 1996.

Signed and Sealed this

Second Day of February, 1999

Attest:

Attesting Officer

*Acting Commissioner of Patents and Trademarks*